(12) United States Patent
Chung

(10) Patent No.: US 7,102,412 B2
(45) Date of Patent: Sep. 5, 2006

(54) LOADING CIRCUIT CAPABLE OF CANCELING DC OFFSET AND MIXER USING THE SAME

(75) Inventor: Yuan-Hung Chung, Hsin Chu County (TW)

(73) Assignee: Sunplus Technology Co., Ltd., Hsin-Chu (TW)

( * ) Notice: Subject to any disclaimer, the term of this patent is extended or adjusted under 35 U.S.C. 154(b) by 19 days.

(21) Appl. No.: 11/046,772

(22) Filed: Feb. 1, 2005

(65) Prior Publication Data
US 2006/0119413 A1 Jun. 8, 2006

(30) Foreign Application Priority Data
Dec. 6, 2004 (TW) .............................. 93137673 A

(51) Int. Cl.
*G06F 7/44* (2006.01)
*G06G 7/16* (2006.01)

(52) U.S. Cl. ...................... 327/359; 327/360; 327/427; 330/252

(58) Field of Classification Search ................ 327/359, 327/355
See application file for complete search history.

(56) References Cited
U.S. PATENT DOCUMENTS

| 4,873,702 A | 10/1989 | Chiu | ........................ 375/376 |
|---|---|---|---|
| 5,748,681 A | 5/1998 | Comino et al. | ............. 375/319 |
| 5,764,086 A * | 6/1998 | Nagamatsu et al. | ........... 327/65 |
| 5,793,230 A | 8/1998 | Chu et al. | ...................... 327/77 |
| 5,798,644 A | 8/1998 | Eslambolchi et al. | ........ 324/326 |
| 5,854,574 A * | 12/1998 | Singer et al. | ................ 330/293 |
| 2005/0195021 A1* | 9/2005 | Cheng | ........................ 327/560 |

\* cited by examiner

*Primary Examiner*—Quan Tra
(74) *Attorney, Agent, or Firm*—Birch, Stewart, Kolasch & Birch, LLP

(57) ABSTRACT

A loading circuit capable of canceling a DC offset and a mixer using the same. The loading circuit includes a first current mirror unit and a second current mirror unit for respectively receiving a first input signal and a second input signal and generating a first signal current and a second signal current proportional to the first and second input signals, a first compensation unit and a second compensation unit for respectively receiving the first and second input signals, filtering AC components of the input signals, and generating a first compensation current and a second compensation current proportional to the DC components of the first and second input signals, a first loading unit for receiving the first signal current and the second compensation current and generating a first output signal, and a second loading unit for receiving the second signal current and the first compensation current and generating a second output signal.

20 Claims, 6 Drawing Sheets

US 7,102,412 B2

LOADING CIRCUIT CAPABLE OF CANCELING DC OFFSET AND MIXER USING THE SAME

This application claims the benefit of the filing date of Taiwan Application Ser. No. 093137673, filed on Dec. 6, 2004, the content of which is incorporated herein by reference.

BACKGROUND OF THE INVENTION

1. Field of the Invention

The invention relates to a loading circuit capable of canceling a DC offset and a mixer using the loading circuit, and more particularly to a loading circuit capable of canceling the DC offset without a large-area capacitor, and a mixer using the loading circuit.

2. Description of the Related Art

FIG. 1 shows the architecture of a most usual zero IF (Intermediate Frequency) or low IF receiver. Referring to FIG. 1, the receiver 10 includes an antenna 11, a LNA (Low Noise Amplifier) 12, mixers 13 and 13', drivers 14 and 14', LPFs (low pass filter) 15 and 15', VGAs (Variable Gain Amplifiers) 16 and 16', ADCs (Analog-to-Digital Converters) 17 and 17', a digital base-band receiver 100, a local oscillator 19, and phase shifters 18 and 18'.

The receiver 10 typically needs the mixers 13 and 13' to mix the clock signals of the phase shifters 18 and 18' with the output signal of the LNA 12 and then output the mixed signals. However, DC offsets exist between the output signal of the LNA 12 and the clock signals of the phase shifters 18 and 18', and the zero IF transceiver has the more serious DC offset. When the DC offset occurs, the subsequent VGAs 16 and 16' enter the saturation mode and cannot effectively achieve the amplification effect thereof accordingly. Thus, the BER (Bit Error Rate) of the transceiver rises or even the transceiver cannot receive any signal.

FIG. 2 shows a typical circuit of a Gilbert cell mixer. As shown in FIG. 2, the loading unit 131 of the mixer 13 utilizes transistors 132 and 133 as loads so as to generate output voltages Voutp and Voutn. Signals Vinp and Vinn are differential inputs, and signals Vlop and Vlon are also differential inputs. Thus, when the input signals have the DC offset, the loading unit 131 cannot cancel the DC offset of the input signals, such that the output voltages Voutp and Voutn also have the DC offset.

There are many conventional technologies for canceling the DC offset, as disclosed in, for example, U.S. Pat. Nos. 4,873,702; 5,748,681; 5,793,230; and 5,798,664. The '702 patent mainly utilizes an ADC (Analog-to-Digital Converter) and a DSP (Digital signal processing) technology to extract the DC offset signal, and then a DAC (Digital-to-Analog Converter) to convert the extracted DC offset signal into an analog signal. The DC offset signal is canceled by subtracting the analog signal from the original signal. This patent has a drawback that complicated ADC, DSP and DAC circuit designs are needed.

The '681 patent mainly utilizes a large capacitor as the high pass filter for canceling the DC offset signal. However, this patent has a drawback that a relatively large MIM (Metal Insulation Metal) or PIP (Poly Insulation Poly) capacitor, which occupies a relatively large IC area, is needed.

The '230 and '664 patent mainly utilize a large capacitor as the low pass filter, and the output of the low pass filter is fed back to the input of the circuit to complete the high pass filter and cancel the DC offset signal. However, these patents have a drawback that a relatively large MIM or PIP capacitor, which occupies a relatively large IC area, is needed.

SUMMARY OF THE INVENTION

It is therefore an object of the invention to provide a loading circuit capable of canceling a DC offset without the need of the complicated ADC, DAC and DSP circuit and the need of relatively large MIM or PIP capacitor, and a mixer using the loading circuit.

To achieve the above-identified object, the invention provides a loading circuit capable of canceling a DC offset. The loading circuit includes a first current mirror unit and a second current mirror unit for respectively receiving a first input signal and a second input signal and generating a first signal current and a second signal current proportional to the first and second input signals, a first compensation unit and a second compensation unit for respectively receiving the first input signal and the second input signal, filtering AC components of the input signals, and generating a first compensation current and a second compensation current proportional to DC components of the first and second input signals, a first loading unit for receiving the first signal current and the second compensation current and generating a first output signal, and a second loading unit for receiving the second signal current and the first compensation current and generating a second output signal.

Because each of the first loading unit and the second loading unit receives the DC components of the two input signals, the voltage difference between the two output signals is free from being influenced by the DC offset of the input signals.

DETAILED DESCRIPTION OF THE INVENTION

The loading circuit of the invention capable of canceling a DC offset and the mixer using the loading circuit will be described with reference to the accompanying drawings.

Figure 1:
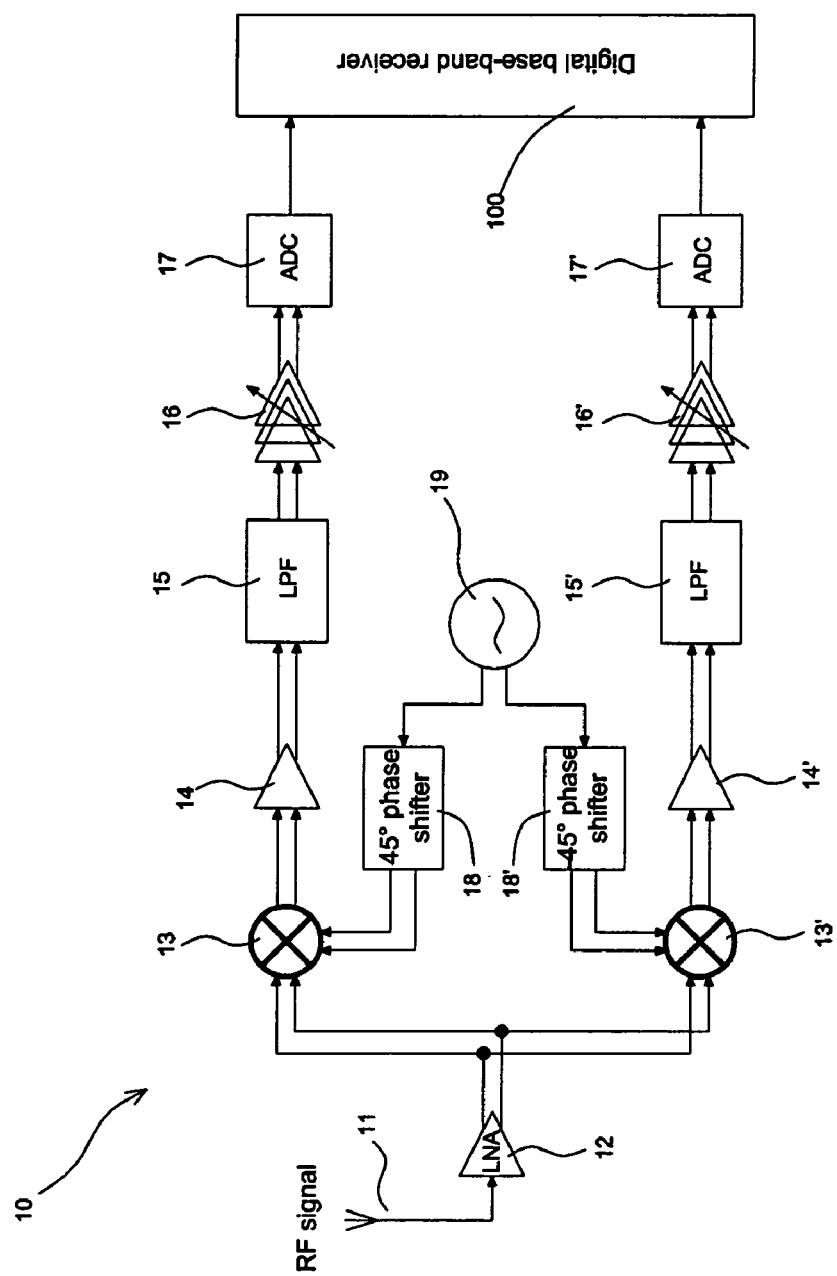
FIG. 1 shows the architecture of a most usual zero IF or low IF receiver.
Figure 2:
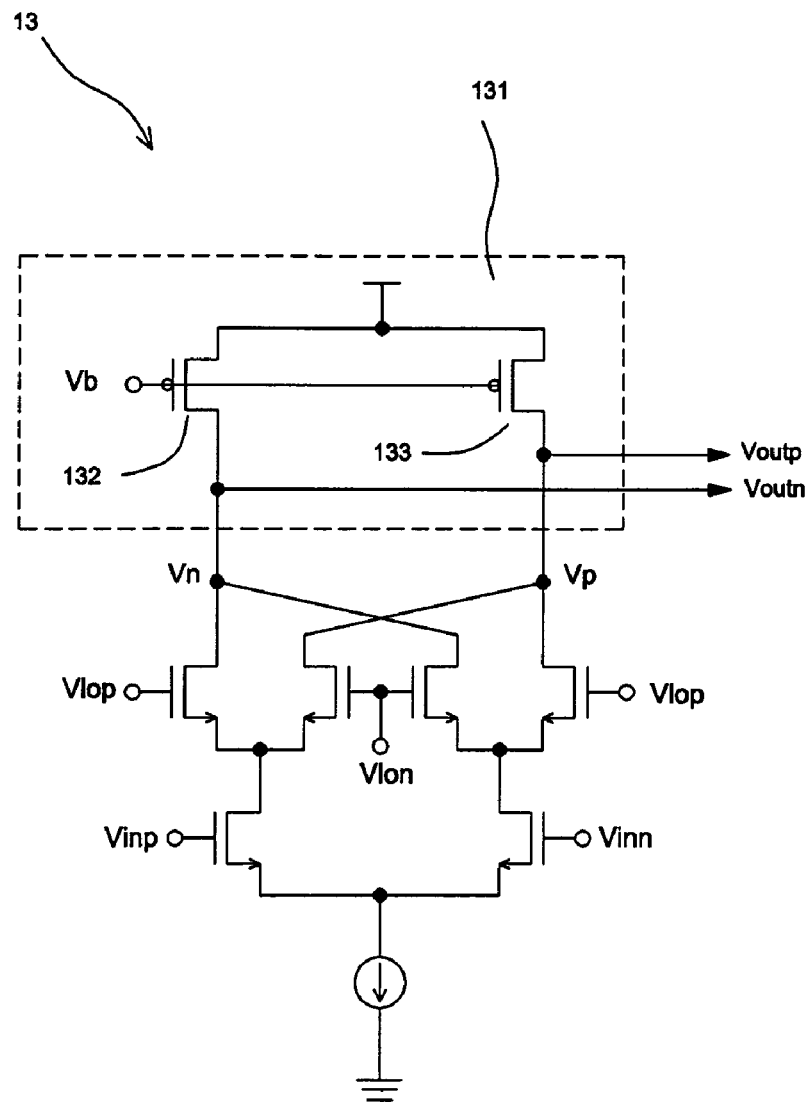
FIG. 2 shows a typical circuit of a mixer.
Figure 3:
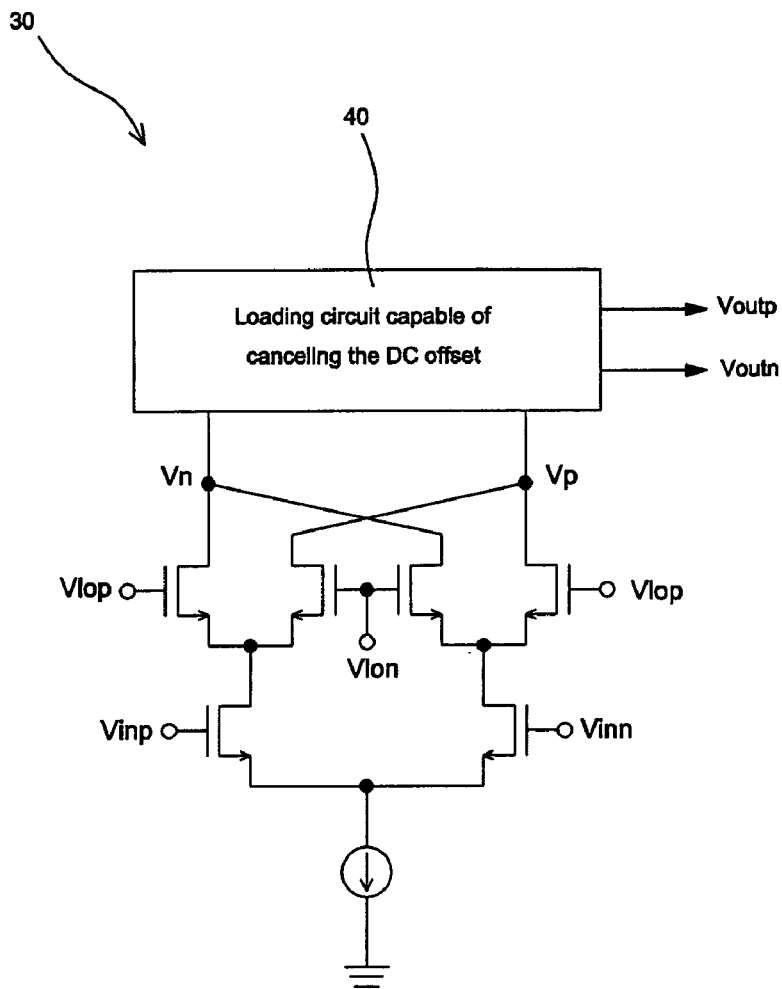
FIG. 3 shows the architecture of a mixer of the invention capable of canceling a DC offset.

FIG. 3 shows the architecture of a mixer of the invention capable of canceling a DC offset. As shown in the drawing, the mixer 30 of the invention capable of canceling the DC offset is similar to the conventional mixer (FIG. 2) except for that the mixer 30 of the invention uses a loading circuit 40 for canceling the DC offset between the output signals Vinp and Vinn so as to generate output signals Voup and Voutn without the DC offset. That is, the mixer 30 of the invention uses the loading circuit 40 capable of canceling the DC offset to replace the loading unit of the conventional mixer.

The loading circuit 40 can cancel the DC offset of the signals Vp and Vn and generates the output signals Voup and Voutn without the DC offset.

Figure 4:
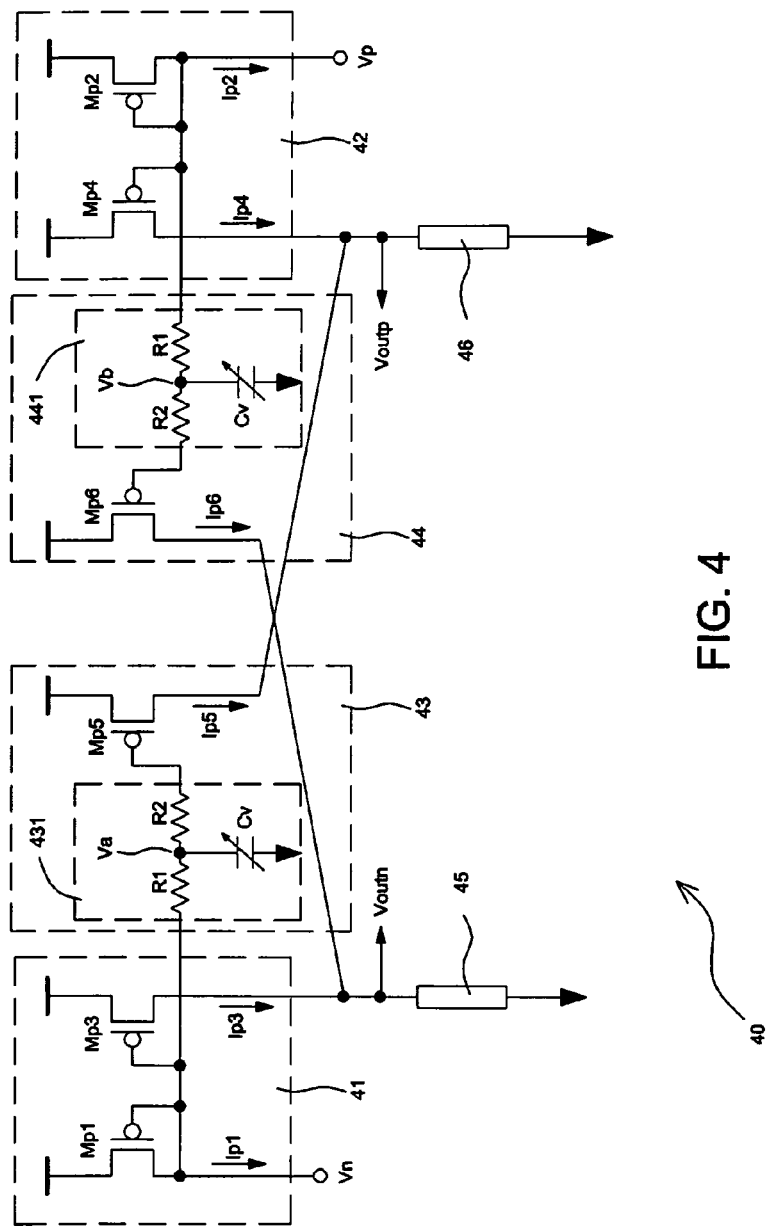
FIG. 4 shows a loading circuit capable of canceling the DC offset according to a first embodiment of the invention.

FIG. 4 shows a loading circuit capable of canceling the DC offset according to a first embodiment of the invention. Referring to FIG. 4, the loading circuit 40 includes a first current mirror unit 41, a second current mirror unit 42, a first compensation unit 43, a second compensation unit 44, a first loading unit 45 and a second loading unit 46.

The first current mirror unit 41 receives a first input signal Vn and generates a first signal current Ip3 proportional to the first input signal Vn. The first compensation unit 43 receives the first input signal Vn, filters AC components of the first input signal Vn, and generates a first compensation current Ip5 proportional to the first input signal Vn. The second current mirror unit 42 receives a second input signal Vp and generates a second signal current Ip4 proportional to the second input signal Vp. The second compensation unit 44 receives the second input signal Vp, filters AC components of the second input signal Vp, and generates a second compensation current Ip6 proportional to the second input signal Vp. The first loading unit 45 receives the first signal current Ip3 and the second compensation current Ip6 and then generates a first output voltage Voutn. The second loading unit 46 receives the second signal current Ip4 and the first compensation current Ip5 and then generates a second output voltage Voutp. Each of the first loading unit 45 and the second loading unit 46 may be a resistor. According to the loading circuit 40 of FIG. 4, the first loading unit 45 receives the first signal current Ip3 as well as the second compensation current Ip6 generated according to the second input signal Vp. The second loading unit 46 receives the second signal current Ip4 as well as the first compensation current Ip5 generated according to the first input signal Vn. Because the first loading unit 45 and the second loading unit 46 respectively receive the DC components of the compensation currents of the second loading unit 46 and the first loading unit 45, the DC offsets of the output signals Voutn and Voutp generated by the first loading unit 45 and the second loading unit 46 of the loading circuit 40 approximate 0.

The first current mirror unit 41 has a current mirror architecture and includes a first transistor Mp1 and a third transistor Mp3. The sources of the first transistor Mp1 and the third transistor Mp3 are connected to the voltage source. The gate and drain of the first transistor Mp1 and the gate of the third transistor Mp3 are connected to the first input signal Vn. The drain of the third transistor Mp3 provides the first signal current Ip3. The second current mirror unit 42 also has a current mirror architecture and includes a second transistor Mp2 and a fourth transistor Mp4. The sources of the second transistor Mp2 and the fourth transistor Mp4 are connected to the voltage source. The gate and drain of the second transistor Mp2 and the gate of the fourth transistor Mp4 are connected to the second input signal Vp. The drain of the fourth transistor Mp4 provides the second signal current Ip4.

The first compensation unit 43 and the first transistor Mp1 also form a current mirror architecture. The first compensation unit 43 includes a first filter unit 431 and a fifth transistor Mp5. The first filter unit 431 receives the first input signal Vn, filters the AC components, and then generates a first filtering signal. The fifth transistor Mp5 has a source connected to the voltage source, a gate for receiving the first filtering signal, and a drain for providing the first compensation current Ip5. The second compensation unit 44 and the second transistor Mp2 also form a current mirror architecture. The second compensation unit 44 includes a second filter unit 441 and a sixth transistor Mp6. The second filter unit 441 receives the second input signal Vp, filters the AC components, and then generates a second filtering signal. The sixth transistor Mp6 has a source connected to the voltage source, a gate for receiving the second filtering signal, and a drain for providing the second compensation current Ip6.

In the design, the first transistor Mp1 and the second transistor Mp2 have the same appearance ratio or W/L ratio (Width/Length ratio), and the third transistor Mp3, the fourth transistor Mp4, the fifth transistor Mp5 and the sixth transistor Mp6 have the same appearance ratio, which is N times that of the first transistor Mp1.

The effect of the loading circuit 40 of the invention capable of canceling the DC offset will be proved according to the following equations. First, it is assumed that, when there is no DC offset signal, the Ip1 and Ip2 signals may be represented as:

$$Ip1 = Ibias - Iac \tag{1}$$

$$Ip2 = Ibias + Iac \tag{2}$$

The Vp and Vn signals may be represented as:

$$Vn = Vbias - Vac \tag{3}$$

$$Vp = Vbias + Vac \tag{4}$$

Meanwhile, because the circuit combination of the R1, R2 and Cv has the effect of the low pass filter with respect to the Vp and Vn signals, the Va and Vb signals may be represented as:

$$Va = Vb = Vbias \tag{5}$$

Thus, the currents Ip3, Ip4, Ip5 and Ip6 flowing through Mp3, Mp4, Mp5 and Mp6 may be represented as:

$$Ip3 = N*Ip1 = N*(Ibias - Iac) \tag{6}$$

$$Ip4 = N*Ip2 = N*(Ibias + Iac) \tag{7}$$

$$Ip5 = N*Ibias \tag{8}$$

$$Ip6 = N*Ibias \tag{9}$$

Finally, the output signals Voutp and Voutn may be represented as:

$$Voutn = (Ip3 + Ip6)*Rload = N*(2Ibias - Iac)*Rload \tag{10}$$

$$Voutp = (Ip4 + Ip5)*Rload = N*(2Ibias + Iac)*Rload \tag{1}$$

$$\Delta Vout = Voutp - Voutn = 2N*Iac*Rload \tag{12}$$

When the signal has the DC offset Idc_offset, the Ip1 and Ip2 signals may be represented as:

$$Ip1 = Ibias - Iac \tag{13}$$

$$Ip2 = Ibias + Iac + Idc\_offset \tag{14}$$

The Vp and Vn signals may be represented as:

$$Vn = Vbias - Vac \tag{15}$$

$$Vp = Vbias + Vac + Vdc\_offset \tag{16}$$

Meanwhile, because the circuit combination of the R1, R2 and Cv has the effect of the low pass filter with respect to the Vp and Vn signals, the Va and Vb signals may be represented as:

$$Va = Vbias \tag{17}$$

$$Vb = Vbias + Vdc\_offset \tag{18}$$

Thus, the currents Ip3, Ip4, Ip5 and Ip6 flowing through the Mp3, Mp4, Mp5 and Mp6 may be represented as:

$$Ip3=N*Ip1=N*(Ibias-Iac) \quad (19)$$

$$Ip4=N*Ip2=N*(Ibias+Iac+Idc\_offset) \quad (20)$$

$$Ip5=N*Ibias \quad (21)$$

$$Ip6=N*(Ibias+Idc\_offset) \quad (22).$$

Finally, the output signals Voutp and Voutn may be represented as:

$$Voutn=(Ip3+Ip6)*Rload=N*(2Ibias-Iac+Idc\_offset)*Rload \quad (23)$$

$$Voutp=(Ip4+Ip5)*Rload=N*(2Ibias+Iac+Idc\_offset)*Rload \quad (24)$$

$$\Delta Vout=Voutp-Voutn=2N*Iac*Rload \quad (25).$$

Because the ΔVout does not contain the DC offset Idc_offset, the DC offset Idc_offset does not influence the voltage difference ΔVout between the output signals Voutp and Voutn. In addition, the capacitor used in the circuit of FIG. 4 may be a MOS capacitor such that the required chip area may be greatly reduced.

Figure 5:
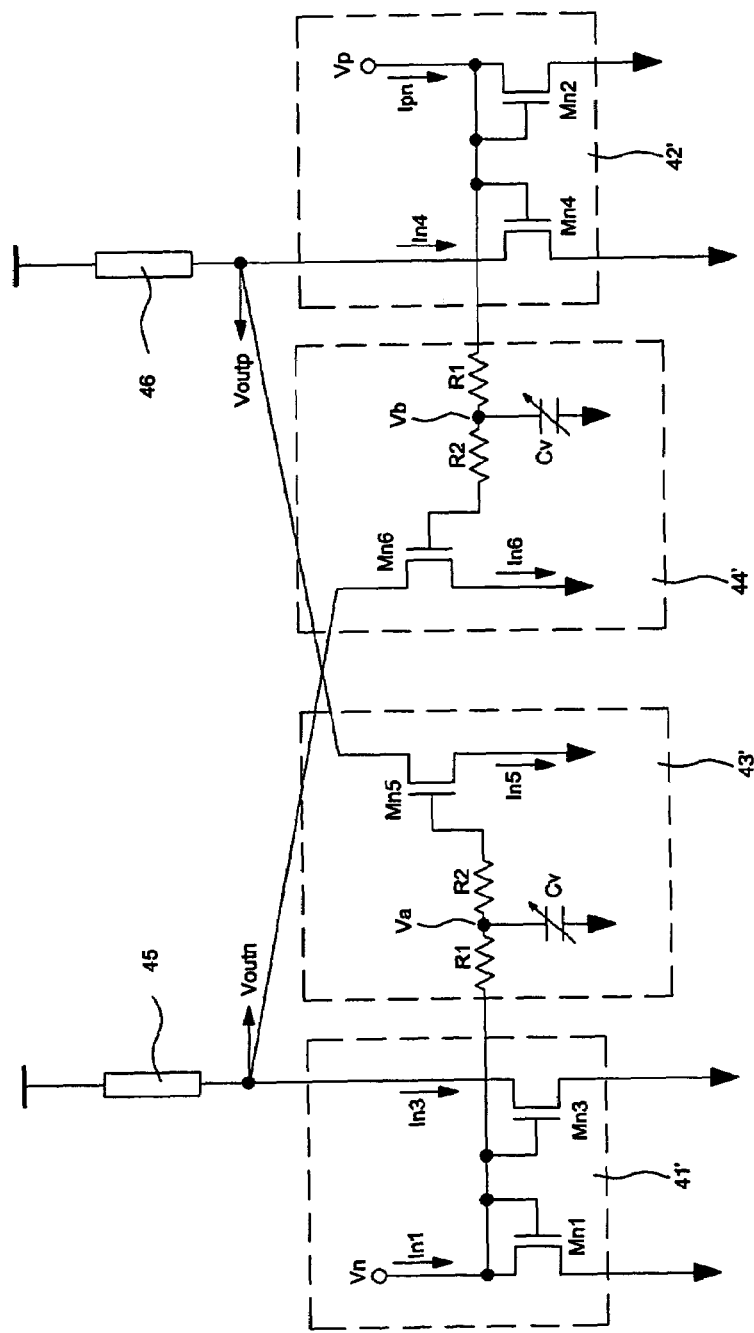
FIG. 5 shows a loading circuit capable of canceling the DC offset according to a second embodiment of the invention.

FIG. 5 shows a loading circuit capable of canceling the DC offset according to a second embodiment of the invention. As shown in FIG. 5, the components of the loading circuit 40' of the second embodiment are the same as those of the loading circuit 40. That is, the loading circuit 40' also includes a first current mirror unit 41', a second current mirror unit 42', a first compensation unit 43', a second compensation unit 44', a first loading unit 45, and a second loading unit 46. The loading circuit 40 of the first embodiment utilizes the PMOS transistors (Mp1 to Mp6), so the loading current flows through the transistors and then through the loading units. However, the loading circuit 40' of the second embodiment utilizes the NMOS transistors (Mn1 to Mn6), so the loading current flows through the loading units and then through the transistors. Consequently, the loading circuit 40' of the second embodiment and the loading circuit 40 of the first embodiment are the same, and detailed description of the second embodiment will be omitted.

Figure 6:
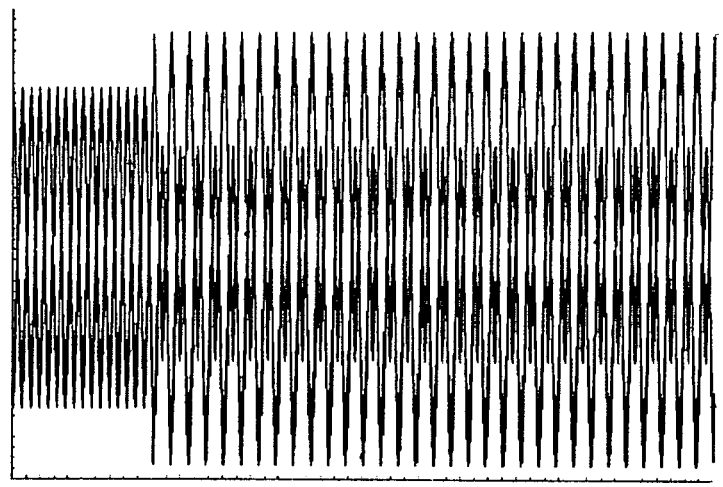
FIG. 6 shows an output signal of a mixer without the DC offset canceling function.
Figure 7:
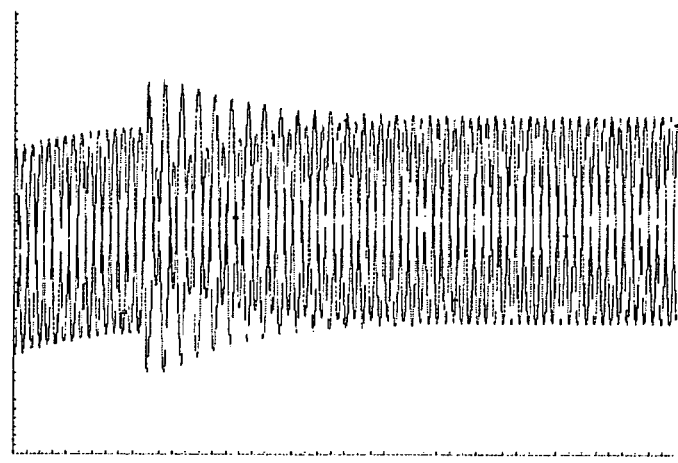
FIG. 7 shows an output signal of a mixer having the loading circuit capable of canceling the DC offset according to the invention.

FIG. 6 shows an output signal of a mixer without the DC offset canceling function, wherein the DC offset occurs at t=2 microseconds. FIG. 7 shows an output signal of a mixer having the loading circuit capable of canceling the DC offset according to the invention, wherein the DC offset occurs at t=2 microseconds, and the DC offset is canceled at t=6 microseconds. Hence, as shown in FIG. 7, the mixer of the invention having the loading circuit can effectively cancel the DC offset.

While certain exemplary embodiments have been described and shown in the accompanying drawings, it is to be understood that such embodiments are merely illustrative of and not restrictive on the broad invention, and that this invention not be limited to the specific construction and arrangement shown and described, since various other modifications may occur to those ordinarily skilled in the art.

What is claimed is:

1. A loading circuit capable of canceling a DC offset, the loading circuit receiving a first input signal and a second input signal and generating a first output signal and a second output signal without the DC offset and comprising:

a first current mirror unit for receiving the first input signal and generating a first signal current proportional to the first input signal;

a first compensation unit for receiving the first input signal, filtering AC components of the first input signal, and generating a first compensation current proportional to DC components of the first input signal;

a second current mirror unit for receiving the second input signal and generating a second signal current proportional to the second input signal;

a second compensation unit for receiving the second input signal, filtering AC components of the second input signal, and generating a second compensation current proportional to DC components of the second input signal;

a first loading unit for receiving the first signal current as well as the second compensation current and generating the first output signal; and a second loading unit for receiving the second signal current as well as the first compensation current and generating the second output signal.

2. The loading circuit according to claim 1, wherein the first current mirror unit comprises:

a first transistor having a source connected to a voltage source, a drain connected to the first input signal, and a gate connected to the drain; and a third transistor having a source connected to the voltage source, a gate connected to the first input signal, and a drain for generating the first signal current.

3. The loading circuit according to claim 2, wherein the second current mirror unit comprises:

a second transistor having a source connected to the voltage source, a drain connected to the second input signal, and a gate connected to the drain; and a fourth transistor having a source connected to the voltage source, a gate connected to the second input signal, and a drain for generating the second signal current.

4. The loading circuit according to claim 3, wherein the first compensation unit comprises:

a first low pass filter for receiving the first input signal and generating a first filtering signal; and a fifth transistor having a source connected to the voltage source, a gate for receiving the first filtering signal, and a drain for generating the first compensation current.

5. The loading circuit according to claim 4, wherein the second compensation unit comprises:

a second low pass filter for receiving the first input signal and generating a second filtering signal; and a sixth transistor having a source connected to the voltage source, a gate for receiving the second filtering signal, and a drain for generating the second compensation current.

6. The loading circuit according to claim 5, wherein the first loading unit is a resistor having a first end for receiving the first signal current and the second compensation current and generating the first output voltage, and a second end that is grounded.

7. The loading circuit according to claim 5, wherein the second loading unit is a resistor having a first end for receiving the second signal current and the first compensation current and generating the second output voltage, and a second end that is grounded.

8. The loading circuit according to claim 5, wherein the first transistor and the second transistor have the same appearance ratio.

9. The loading circuit according to claim 8, wherein the third transistor, the fourth transistor, the fifth transistor and the sixth transistor have the same appearance ratio.

10. The loading circuit according to claim 8, wherein the third transistor, the fourth transistor, the fifth transistor and the sixth transistor have the same appearance ratio, which is N times that of the first transistor.

11. The loading circuit according to claim 1, wherein the first current mirror unit comprises:
   a first transistor having a source that is grounded, a drain connected to the first input signal, and a gate, which is connected to the drain and generates the first input signal; and
   a third transistor having a source that is grounded, a gate connected to the first input signal, and a drain for generating the first signal current.

12. The loading circuit according to claim 11, wherein the second current mirror unit comprises:
   a second transistor having a source that is grounded, a drain connected to the second input signal, and a gate, which is connected to the drain and generates the second input signal; and
   a fourth transistor having a source that is grounded, a gate connected to the second input signal, and a drain for generating the second signal current.

13. The loading circuit according to claim 12, wherein the first compensation unit comprises:
   a first low pass filter for receiving the first input signal and generating a first filtering signal; and
   a fifth transistor having a source that is grounded, a gate for receiving the first filtering signal, and a drain for generating the first compensation current.

14. The loading circuit according to claim 13, wherein the second compensation unit comprises:
   a second low pass filter for receiving the first input signal and generating a second filtering signal; and
   a sixth transistor having a source that is grounded, a gate for receiving the second filtering signal, and a drain for generating the second compensation current.

15. The loading circuit according to claim 14, wherein the first loading unit is a resistor having a first end for receiving the first signal current and the second compensation current and generating the first output voltage, and a second end connected to the voltage source.

16. The loading circuit according to claim 14, wherein the second loading unit is a resistor having a first end for receiving the second signal current and the first compensation current and generating the second output voltage, and a second end connected to the voltage source.

17. The loading circuit according to claim 14, wherein the first transistor and the second transistor have the same appearance ratio.

18. The loading circuit according to claim 17, wherein the third transistor, the fourth transistor, the fifth transistor and the sixth transistor have the same appearance ratio.

19. The loading circuit according to claim 17, wherein the third transistor, the fourth transistor, the fifth transistor and the sixth transistor have the same appearance ratio, which is N times that of the first transistor.

20. The loading circuit according to claim 1 being used in a mixer.

* * * * *